United States Patent

Kawabe

(10) Patent No.: US 8,711,138 B2
(45) Date of Patent: Apr. 29, 2014

(54) PIXEL CIRCUIT

(75) Inventor: Kazuyoshi Kawabe, Kanagawa (JP)

(73) Assignee: Global OLED Technology LLC, Herdon, VA (US)

( * ) Notice: Subject to any disclaimer, the term of this patent is extended or adjusted under 35 U.S.C. 154(b) by 907 days.

(21) Appl. No.: 12/746,900

(22) PCT Filed: Dec. 1, 2008

(86) PCT No.: PCT/US2008/013254
§ 371 (c)(1),
(2), (4) Date: Aug. 10, 2010

(87) PCT Pub. No.: WO2009/075740
PCT Pub. Date: Jun. 18, 2009

(65) Prior Publication Data
US 2010/0295758 A1    Nov. 25, 2010

(30) Foreign Application Priority Data

Dec. 10, 2007  (JP) .................................. 2007-318673

(51) Int. Cl.
    *G09G 5/00*    (2006.01)
(52) U.S. Cl.
    USPC ........... 345/212; 345/204; 345/205; 345/207; 345/208; 345/210
(58) Field of Classification Search
    CPC .............. G09G 2300/0819; G09G 2300/0852; G09G 2300/0861; G09G 2310/0262; G09G 3/3233
    USPC ........................ 345/55, 76–92, 204–212, 690; 315/169.1–169.3, 228; 348/801
    See application file for complete search history.

(56) References Cited

U.S. PATENT DOCUMENTS

| | | | |
|---|---|---|---|
| 6,521,913 B1 * | 2/2003 | Murade | 257/59 |
| 6,859,193 B1 * | 2/2005 | Yumoto | 345/82 |
| 8,289,234 B2 * | 10/2012 | Kim | 345/76 |
| 8,446,343 B2 * | 5/2013 | Akimoto et al. | 345/76 |
| 2003/0062844 A1 * | 4/2003 | Miyazawa | 315/169.3 |
| 2004/0144988 A1 * | 7/2004 | Jung | 257/98 |
| 2004/0207615 A1 * | 10/2004 | Yumoto | 345/211 |
| 2005/0067971 A1 | 3/2005 | Kane | |
| 2005/0243035 A1 | 11/2005 | Kwak | |
| 2006/0221015 A1 * | 10/2006 | Shirasaki et al. | 345/77 |
| 2006/0221028 A1 | 10/2006 | Aoki | |
| 2007/0001205 A1 | 1/2007 | Kimura | |
| 2007/0018078 A1 * | 1/2007 | Miyazawa | 250/214.1 |
| 2007/0040770 A1 * | 2/2007 | Kim | 345/76 |
| 2007/0296652 A1 * | 12/2007 | Imamura et al. | 345/76 |
| 2008/0013254 A1 | 1/2008 | Miller | |
| 2008/0062095 A1 * | 3/2008 | Park et al. | 345/80 |
| 2009/0207156 A1 * | 8/2009 | Miyazawa | 345/204 |

FOREIGN PATENT DOCUMENTS

WO    WO 98/48403    10/1998

\* cited by examiner

*Primary Examiner* — Prabodh M Dharia
(74) *Attorney, Agent, or Firm* — Global OLED Technology LLC

(57) ABSTRACT

A pixel circuit for an electroluminescent element with a first storage capacitor formed overlapping a data line and which comprises a section where a semiconductor thin film constituting the switching transistor or the reset transistor extends, an insulating film, and a metal layer which is connected to the data line as a first terminal. A first terminal of a switching transistor and a first terminal of a reset transistor are connected to the second terminal of the first storage capacitor. The second terminal of the switching transistor is connected to a driving transistor. A second storage capacitor connects the control terminal and the first terminal of the switching transistor. The electroluminescent element is connected to the second terminal of the driving transistor through a light emission controlling transistor.

2 Claims, 8 Drawing Sheets

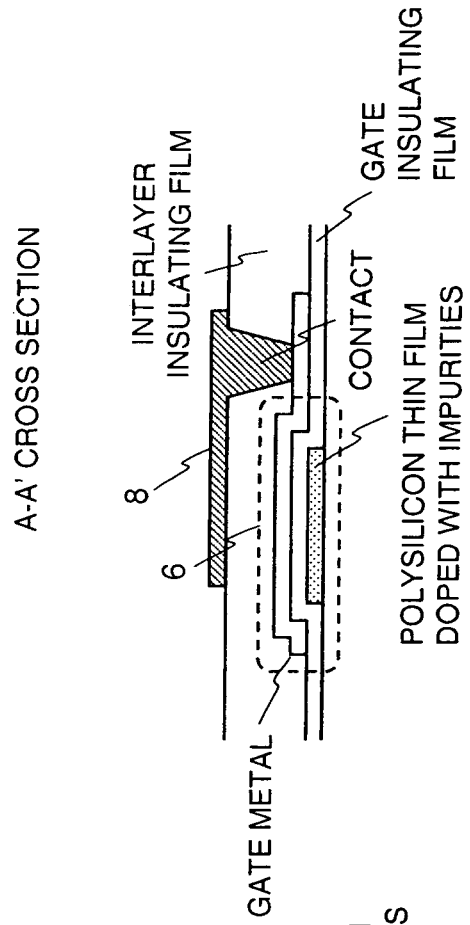
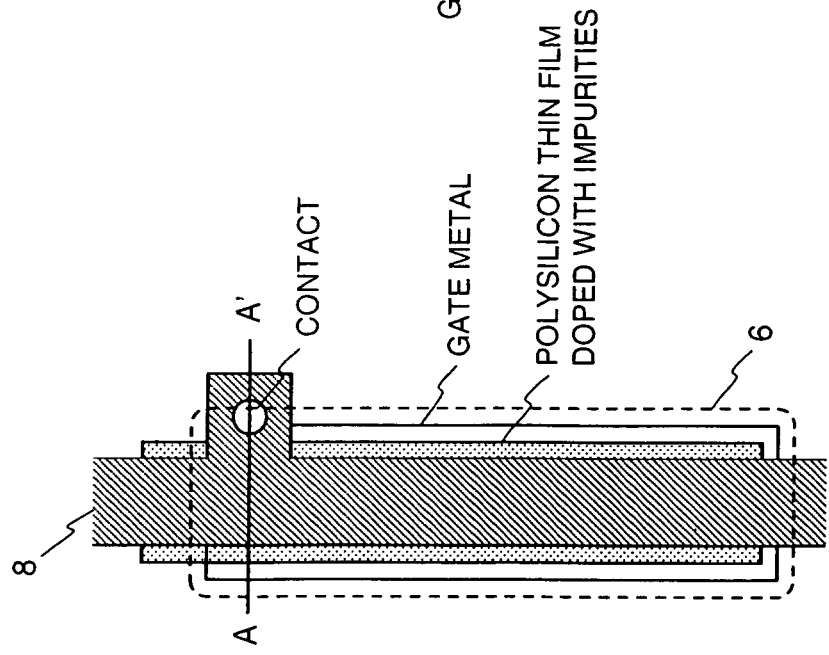
FIG. 2A
FIG. 2B

US 8,711,138 B2

PIXEL CIRCUIT

This application is a National Stage Entry of International Application No. PCT/US2008/013254, filed Dec. 1, 2008, and claims the benefit of Japanese Application No. 2007-318673, filed on Dec. 10, 2007, which is hereby incorporated by reference for all purposes as if fully set forth herein.

FIELD OF THE INVENTION

The present invention relates to a pixel circuit of an organic EL display or the like.

BACKGROUND OF THE INVENTION

Because an organic EL display is of self-emissive type, it has high contrast and fast response, making is suitable for moving picture applications such as a television for displaying natural images. Generally, an organic EL element is driven at a constant current using a control element such as a transistor, but since the transistor in this case is used in the saturation region, different currents are generated in each pixel, even with the same gradation voltage (voltage step) supplied to the pixel, because of variations in Vth (threshold voltage) and mobility characteristics of the transistor, and it is not possible to keep the emission brightness uniform, which is a problem. In order to solve this problem, a structure having a circuit for compensating for Vth provided inside a pixel is disclosed in WO 1998048403.

FIG. 7 shows the pixel circuit disclosed WO 1998048403. In FIG. 7, a gate of a p-channel switching transistor P4 having a source connected to a data line is connected to a gate line, and the drain of this transistor P4 is connected to the gate of a p-channel driving transistor P1 via a capacitor Cc. The source of the driving transistor P1 is connected to power supply VDD, while the drain is connected via a p-channel light emission controlling transistor P2 and the organic EL element OLED to a negative power supply. Also, a capacitor Cs is arranged between the gate of the driving transistor P1 and the power supply VDD, with a reset transistor P3 being arranged between the gate and source of the driving transistor P1.

With this structure, in a state where the light emission controlling transistor P2 has been turned off by the light emission control line, power supply potential VDD is supplied to the data line, the switching transistor P4 and the reset transistor P3 are turned on by the gate line and the reset line, and Vth is written to the capacitors Cc and Cs. Next, the reset transistor P3 is turned off to apply a data line gradation signal voltage Vsig to the gate of the driving transistor P1 via the capacitor Cc, and a gate voltage Vg=Cc/(Cc+Cs)×Vsig+Vth is applied to the gate terminal of the driving transistor P1.

In this way, since this Vth is always added to the gradation signal voltage as an offset at the gate terminal of the driving transistor, Vth is automatically corrected. However, since a dynamic range of the gradation signal voltage is reduced to Cc/(Cc+Cs), it is preferable to make Cc sufficiently large compared to Cs in order to avoid this. However, if Cc is made larger the surface area occupied by Cc in the pixel section increases, making the surface area of an opening section disadvantageously larger. As a result, the organic EL element is driven at a high current density, and it is difficult to ensure reliability, such as lifespan.

It is also difficult to correct mobility with the Vth correction circuit of the related art disclosed in patent document 1, and it is difficult to ensure high brightness uniformity in a wide gradation range when there are variations in mobility between pixels. Also, an organic EL element generally has reduced emission brightness accompanying light emission, but with the pixel circuit of the related art it is also not possible to correct the lowering of light emission brightness.

SUMMARY OF THE INVENTION

The present invention is directed to (a pixel circuit) comprising a first storage capacitor having a first terminal connected to a data line, a switching transistor having a first terminal connected to this first storage capacitor and which is switched ON and OFF by a selection line, a driving transistor having a control terminal connected to a second terminal of the switching transistor and having a first terminal connected to a power supply, an organic electroluminescence element which is connected to a second terminal of the driving transistor through a light emission controlling transistor, a second storage capacitor which connects the control terminal of the driving transistor and a first power supply side terminal, and a reset transistor which connects a second terminal of the driving transistor on the side near the light emission controlling transistor and the control terminal of the driving transistor or the side of the first storage capacitor near the driving transistor, wherein the first storage capacitor is formed overlapping the data line.

It is also possible for the first storage capacitor to comprise a section where a semiconductor thin film constituting the switching transistor or the reset transistor extends, an insulating film formed with the same process as for a gate insulation film of the switching transistor or the reset transistor, and a metal layer formed with the same process as for the gate electrode of the switching transistor or the reset transistor, wherein the metal layer and the data line are connected by a contact.

It is also possible, after a voltage corresponding to a threshold voltage of the driving transistor has been written to the gate of the driving transistor, to turn off the switching transistor while the reset transistor and the light emission controlling transistor are turned on, and for a voltage obtained by voltage division of the power supply voltage by an organic electroluminescence element and the driving transistor to be written to the gate of the driving transistor by current flowing in the driving transistor.

In this way, according to the present invention, it is possible to form a storage capacitor overlapping a data line. Accordingly, obtaining a large capacitance storage capacitor is easy. In this way it is possible to easily perform threshold value compensation for the driving transistor.

BRIEF DESCRIPTION OF THE DRAWINGS

FIG. 2A is a plan view showing the structure of a first storage capacitor;

FIG. 2B is a cross sectional view showing the structure of the first storage capacitor;

DESCRIPTION OF THE PREFERRED EMBODIMENTS

Figure 1:
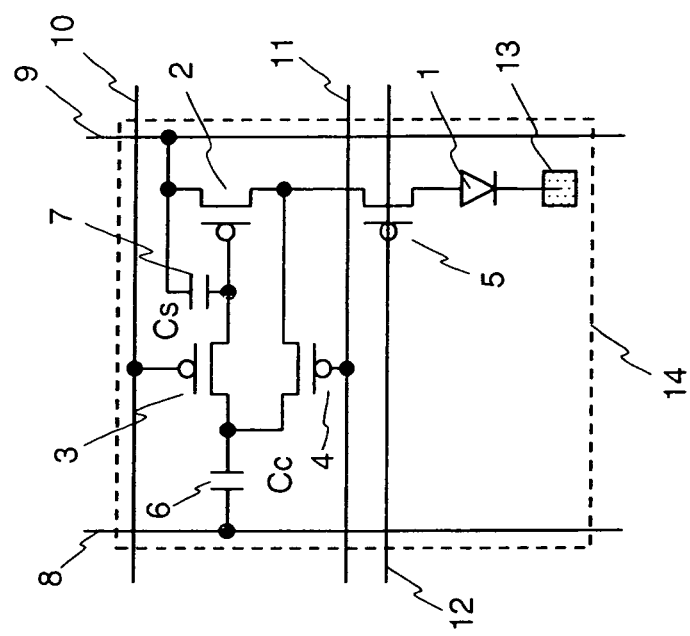
FIG. 1 is a drawing showing the structure of one example of a pixel circuit of the embodiments.

Embodiments of the present invention will be described in the following based on the drawings. A pixel circuit for the pixel 14 of this embodiment is shown in FIG. 1. An organic EL element 1 has its cathode connected to a cathode electrode 13 common to all pixels (for supplying VSS), and its anode connected to a drain terminal of a light emission controlling transistor 5 having a gate terminal connected to a light emission control line 12. A source terminal of the light emission controlling transistor 5 is connected to a drain terminal of a driving transistor 2 having a source connected to a power supply line 9 common to all pixels (for supplying VDD).

A source terminal of a reset transistor 4 having a gate terminal connected to a reset line 11 is connected to a connection point of the light emission controlling transistor 5 and the driving transistor 2, while the drain terminal of the reset transistor 4 is connected to one end of a first storage capacitor 6 having its other end connected to a data line 8, and to a drain terminal of a switching transistor 3 that has its gate terminal connected to a gate line 10. The source terminal of the switching transistor 3 is connected to a gate terminal of the driving transistor 2 and to one end of a second storage capacitor 7 that has its other end connected to a power supply line 9, to thus constitute the pixel 14.

The first storage capacitor 6 has a capacitance value Cc, and the second storage capacitor 7 has a capacitance value Cs. The fact that it is preferable, in preventing reduction in dynamic range of a gradation signal voltage Vsig supplied to the data line 8, to make the capacitance value Cc of the first storage capacitor large compared to the capacitance value Cs of the second storage capacitor has been described previously. With this embodiment, the pixel 14 is constructed so that it is possible to ensure that the capacitance Cc is sufficiently large, because it is possible to form the first storage capacitor 6 by coupling with the data line 8.

FIGS. 2A and 2B show an example of the first storage capacitor 6 formed along the data line 8. One end of the first storage capacitor 6 is connected to the data line 8, while the other end is connected to drain terminals of the switching transistor 3 and the reset transistor 4. It is therefore convenient to form the capacitor with a polysilicon thin film doped with impurities, wherein it is possible to use one end of the first storage capacitor 6 as the data line and to use the other end as drain terminals of the switching transistor 3 and the reset transistor 4.

Here, the first storage capacitor 6 shown in FIG. 2A and FIG. 2B is formed by sandwiching a gate insulating film with a gate element and a polysilicon thin film that has been doped with impurities, and the gate insulating film is formed on the polysilicon thin film that has been doped with impurities, and metal of the data line 8 is formed on thus gate insulating film by way of gate metal and a further interlayer insulating film. In this way the first storage capacitor 6 is formed based on a general polysilicon process. Then as shown in the cross section A-A', by connecting the data line 8 and the gate metal by way of a contact, one end of the first storage capacitor constitutes the data line 8 and the other end constitutes the polysilicon thin film that has been doped with impurities, and the first storage capacitor 6 shown in FIG. 2A and FIG. 2B functions as the storage capacitor 6 of FIG. 1.

The polysilicon thin film that has been doped with impurities is formed by extending the drain terminals of the switching transistor 3 and the reset transistor 4, and the gate metal of the first storage capacitor 6 is formed by the same process as the gate electrodes of the transistors, but they are electrically isolated. A central section of the polysilicon thin film is a channel region that is basically not doped with impurities, and there are a drain region and a source region at either side that are doped with impurities, and by arranging the gate electrode on the channel region via a gate insulating film a transistor is formed.

By configuring a pixel circuit in this way, it is possible to form the first storage capacitor 6 using a coupling with the data line 8, which shows that by forming the first storage capacitor 6 along the data line 8 it is possible to make the capacitance value Cc of the storage capacitor 6 sufficiently large.

The storage capacitor 6 can also be formed by way of an interlayer insulating film, besides by way of the gate insulating film, and besides polysilicon doped with impurities the metal functioning as the terminals of the storage capacitor can use gate metal etc. More specifically, by not forming the contact between the data line and the gate metal as shown in FIG. 2B, and connecting the gate metal to the polysilicon thin film that has been doped with impurities and used as drain electrodes for the switching transistor 3 and the reset transistor 4, an area, where the gate metal and the data line 8 opposing via the interlayer insulation film functions as the storage capacitor 6.

Figure 2C:
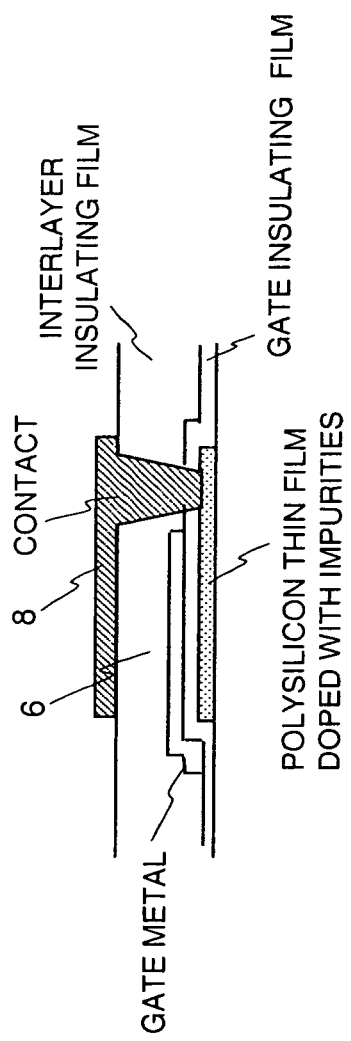
FIG. 2C is a cross sectional view showing another structural example of the first storage capacitor.

For example, with the configuration of FIG. 2C, the polysilicon thin film that has been doped with impurities is connected to the data line 8. This polysilicon thin film that has been doped with impurities is isolated from the drain terminals of the switching transistor 3 and the reset transistor 4. On the other hand, the gate metal is connected to the drain terminals of the switching transistor 3 and the reset transistor 4 by contacts. In this manner, both between the gate metal and the data line, and between the gate metal and the polysilicon thin film doped with impurities, function as the first storage capacitor 6.

Figure 3:
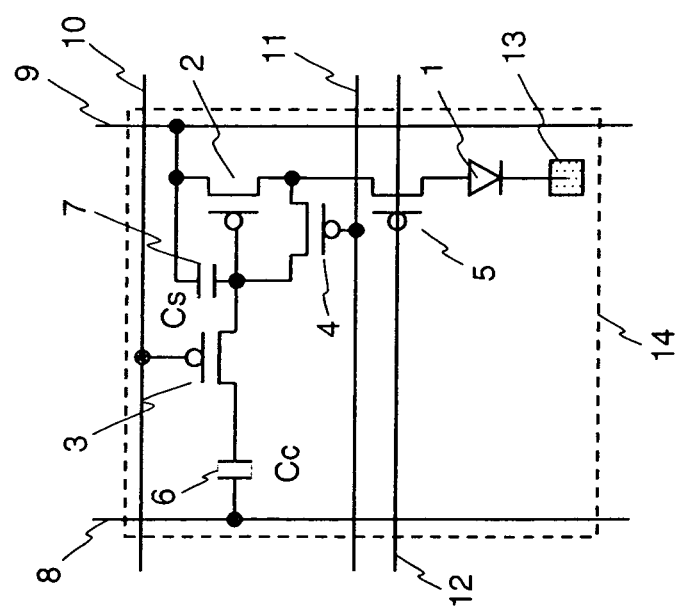
FIG. 3 is a drawing showing the structure of another example of a pixel circuit of the embodiments.

An example of another pixel 14 of the present invention is shown in FIG. 3. A point of difference from FIG. 1 is that the drain terminal of the reset transistor 4, is connected to the gate terminal of the driving transistor 2, the end of the second storage capacitor 7 that is not connected to the power supply line 9, and the source terminal of the switching transistor 3. In this pixel 14 also, by using the control method that will be described next it is possible to correct Vth of the driving transistor 2.

Figure 4:
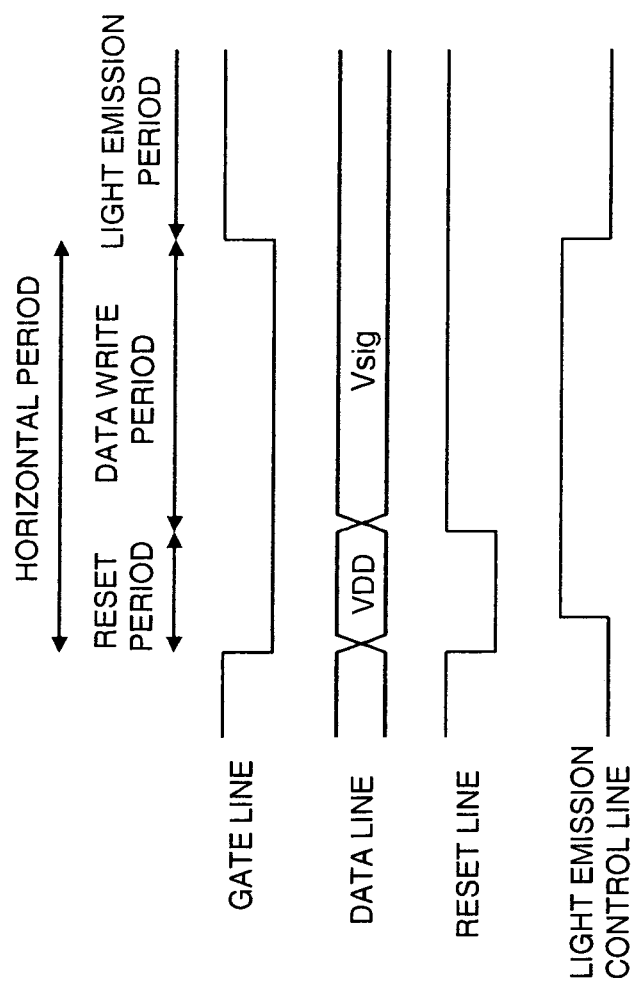
FIG. 4 is a timing chart showing an example of states of each line.

A control method for correcting Vth of the driving transistor 2 using the pixel 14 of FIG. 1 and FIG. 3 is shown in FIG. 4. As shown in FIG. 4, a horizontal period is divided into a reset period and a date write period, and the operation of the pixel 14 is different in each period.

In a horizontal period in which the line of the pixel 14 is selected, the gate line 10 is selected, but in the initial reset period the reset line 11 is first set Low. As a result, the switching transistor 3 and the reset transistor 4 are turned on, and the driving transistor 2 is diode connected causing current to flow in the organic EL element 1. After that, the current that is flowing in the organic EL element 1 is made to flow via the reset transistor 4 to the first and second storage capacitors 6 and 7 by setting the light emission control line 12 to High. While this is happening the same power supply voltage VDD as on the power supply line 9 is supplied to the data line 8, and so by the time a certain time has elapsed and current no longer flows Vth is held at the first and second storage capacitors 6 and 7. Since the reset transistor 4 is turned off by setting the reset transistor 11 High at this time, the potential held at the first and second storage capacitors 6 and 7 is settled, and the reset period is completed.

After that, if the gradation control voltage Vsig is supplied to the data line 8, the gate voltage Vg of the driving transistor 2 is controlled to Vg=Cc/(Cc+Cs)*Vsig+Vth by adding a potential that is proportional to the gradation signal voltage Vsig to Vth using coupling with the first coupling capacitor 6, and Vth of the driving transistor 2 is corrected. However, the previously described reset period does not have to be maintained until there is substantially no current flow in the driving transistor 2, and can be an appropriate time such as a few μs to a few tens of μs.

The capacitance Cc of the first storage capacitor 6 is sufficiently larger than the capacitance Cs of the second storage capacitor 7, which shows that Cc/(Cc+Cs) is substantially equal to 1, and the dynamic range of the gradation signal voltage Vsig is maintained.

Once the horizontal period is completed, the light emission control line is made Low, a current corresponding to the written gradation signal voltage Vsig flows in the organic EL element 1 via the light emission controlling transistor 5, and light emission is maintained until the line of the next pixel 14 is selected.

Vth is corrected by controlling the pixel 14 as described above, but if the mobility of the driving transistor 2 is different for every pixel, current flowing in the organic EL element 1 will vary even if it is possible to correct only Vth. Therefore, a voltage difference arises between pixels, and brightness uniformity is deteriorated. Consequently, brightness variation due to differences in mobility are corrected by controlling the pixel 14 of FIG. 1 as described in the following.

Figure 5:
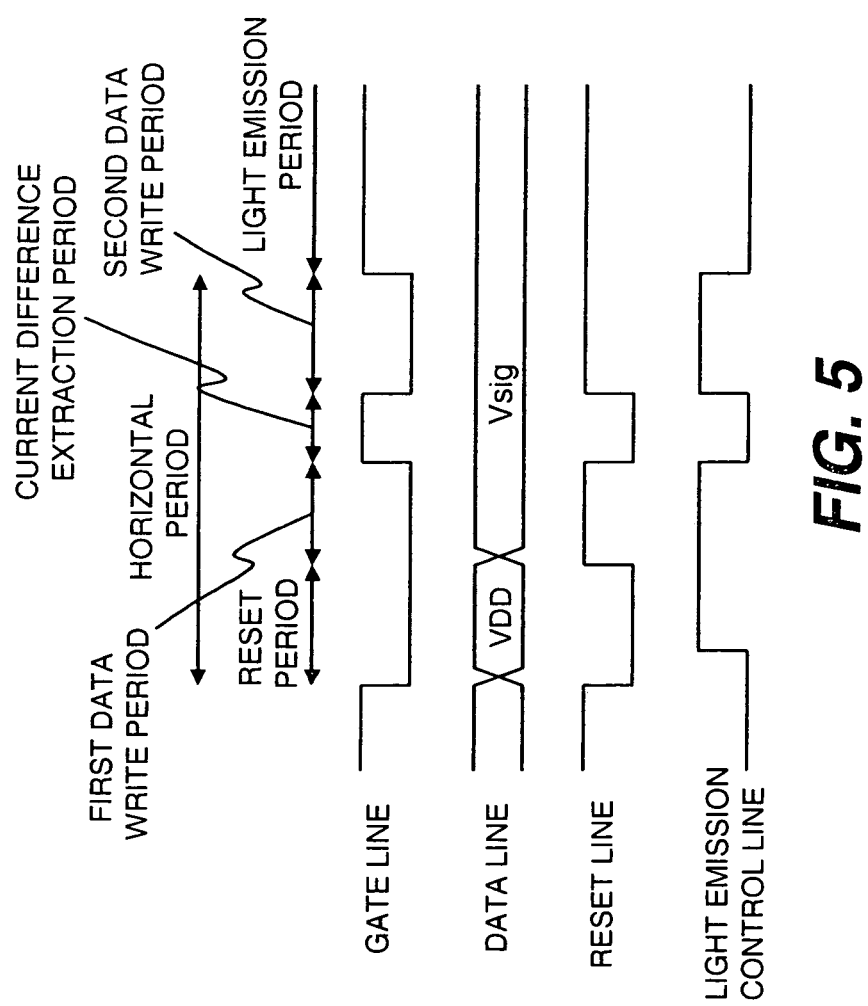
FIG. 5 is a timing chart showing another example of states of each line.

FIG. 5 shows a control method for performing mobility correction in addition to Vth correction. Differing from FIG. 4, the horizontal period is divided into 4, namely a reset period, a first data write period, a current difference extraction period, and a second data write period. In the reset period, similar to FIG. 4, when the gate line 10 of the pixel 14 is selected the driving transistor 2 is diode connected by setting the reset line 11 to Low, and current temporarily flows in the organic EL element. Next, by setting the light emission control line 12 to High a current path to the organic EL element 1 is cut off, current continues to flow into the first and second storage capacitors 6 and 7, and Vth is written (reset period).

After that, if the reset line 11 is set to High, Vth written to the first and second storage capacitors 6 and 7 is settled, and by supplying the gradation signal voltage Vsig to the data line 8 Vth is corrected at the gate voltage of the driving transistor 2 and a potential Vg=Cc/(Cc+Cs)+Vth that is the gradation signal voltage Vsig inverted is generated. Therefore, a current with Vth corrected is made to flow in the organic EL element 1 by setting the light emission control line 12 to Low (first data write period).

Here, once the gate line 10 is set High, current with Vth corrected continues to flow even if deselected. If the reset line 11 is set Low at this time, the potential stored at the first storage capacitor 6 varies in accordance with current flowing in the organic EL element 1. That is, if the reset line 11 is set Low, current flows from the first storage capacitor 6 to the organic EL element 1 via the reset transistor 4, but if a large current is flowing in the organic EL element 1 (mobility of the driving transistor 2 is high) the voltage across the source and drain of the reset transistor 4 becomes smaller which shows that a current discharged from the first storage capacitor 6 becomes small, while if the current flowing in the organic EL element is small (mobility of the driving transistor 2 is low) the voltage across the source and drain of the reset transistor 4 becomes high causing the current discharged from the first storage capacitor 6 to be large.

Once the current difference extraction period in which the reset line 11 is made Low elapses and the reset line 11 is set High, the potential on a reset transistor side end of the first storage transistor 6 becomes a higher potential in the event that the mobility of the driving transistor 2 is high, or a lower potential in the event that the mobility of the driving transistor 2 is low, and a potential corresponding to the mobility of the driving transistor 2 is reflected at the first storage capacitor 6 (current difference extraction period).

If this type of mobility correction is carried out, the gate line 10 is selected again, and the potential reflected at the first storage capacitor 6 is written to the second storage capacitor 7 (second data write period). In this way, in the event that the mobility of the driving transistor 2 is high, a higher potential is written to the second storage capacitor 7 to suppress the current of the driving transistor 2, while if the mobility is low a lower potential is written to the second storage capacitor 7 to stimulate the current of the driving transistor 2.

Since the gradation signal voltage Vsig continues to be supplied to the data line 8 except in the reset period, the same mobility correction is carried out at all gradations, but because the source drain voltage of the reset transistor 4 becomes large in the current difference extraction period and a required current or greater flows from the first storage capacitor 6 in the case of low gradation, it is preferable that the current difference extraction period not be too long. Alternatively, it is possible to make the Low level of the reset line 11 comparatively high, and make the on resistance of the reset transistor 4 large, or to lengthen the channel length of the reset transistor 4 and increase the on resistance to avoid excessive current flowing.

If the pixel 14 of FIG. 1 is controlled as described above, it is possible to correct not only Vth but also mobility, but if the organic EL element 1 deteriorates and becomes high resistance, then at the time of current difference extraction the source drain voltage of the reset transistor 4 is affected more by the raise in voltage of the organic EL element 1, which shows that the above described mobility correction no longer functions appropriately. It is therefore preferable to perform the following homogenization processing for the organic EL element 1.

Figure 6:
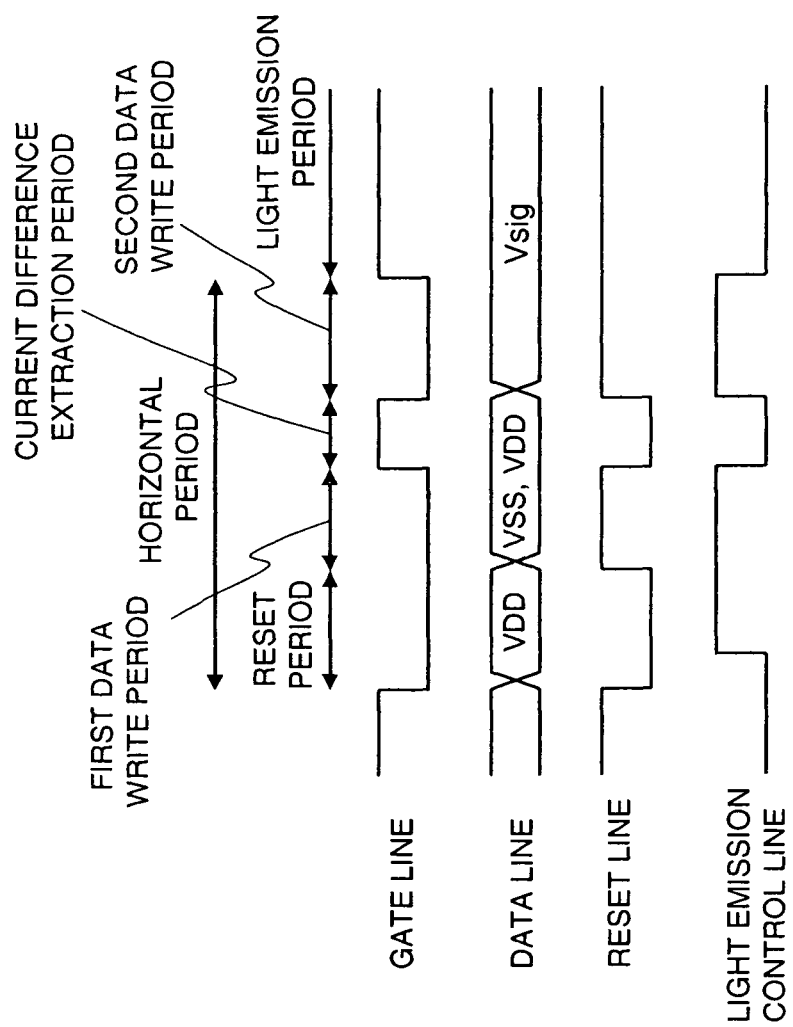
FIG. 6 is a timing chart showing a further example of states of each line.
Figure 7:
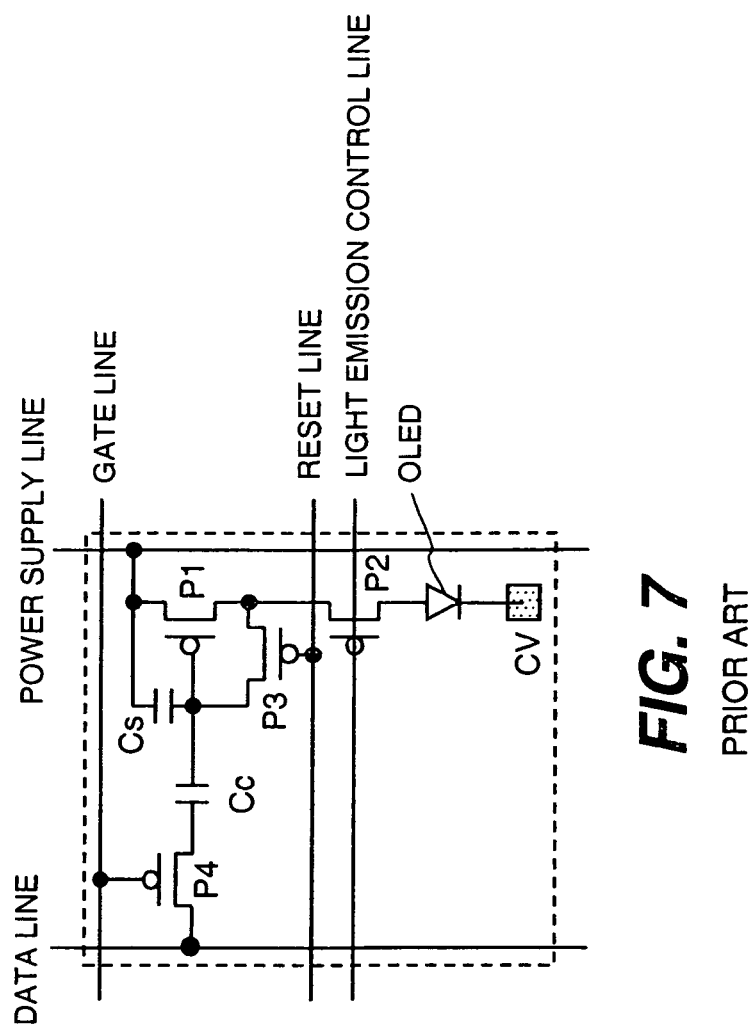
FIG. 7 is a drawing showing the structure of a pixel circuit of the related art.

FIG. 6 shows a control method for carrying out homogenization processing for the organic EL element 1 using the pixel 14 of FIG. 1. The procedure of the homogenization processing is the same as for FIG. 5, in that the horizontal period is divided into 4 periods, namely a reset period, a first data write period, a current difference extraction period, and a second data write period. If the same reset period as in FIG. 4 and FIG. 5 is completed and Vth is written to the first and second storage capacitors 6 and 7, the cathode potential VSS is supplied to the data line 8 (it can also be a low voltage corresponding to VSS), and by writing to the second storage capacitor 7 the first data write period is completed. In this way, the gate voltage of the driving transistor 2 becomes sufficiently low, and the driving transistor 2 operates in the linear region. If the gate line 10 becomes High in the current difference extraction period and is unselected, the second storage capacitor 7 is isolated from the first storage capacitor 6 and by setting the reset line 11 and the light emission control line 12 Low a potential that is voltage divided by the organic EL element 1 and the on resistance of the driving transistor 2 is written to a reset transistor side terminal of the first storage capacitor 6.

If the organic EL element 1 is degraded and its resistance becomes high, the current flowing from the power supply line 9 to the organic EL element 1 becomes small and the drain potential of the driving transistor 2 during an on operation rises because voltage lowering becomes small. In the event that there is low degradation, the current flowing from the power supply line 9 to the organic EL element 1 increases, and as a result the drain potential of the driving transistor 2 during an on operation falls with large lowering of voltage. The drain potential of the driving transistor 2 is written via the reset transistor 4 to the first storage capacitor 6, which shows that degradation of the organic EL elements 1 is reflected to the first storage capacitor 6. Alternatively, it is also possible to reflect degradation of the organic EL element 1 at the first storage capacitor 6 by supplying the VDD potential (or a potential higher than VDD) to the data line 8 in the first data write period after the reset period is completed, and writing to the second storage capacitor 7 to reliably turn off the driving transistor 2. That is, if the reset transistor 4 and the light emission controlling transistor 5 are turned on in a state where the driving transistor 2 is off, current flows from the data line 8 that is maintained at VDD, through the first storage capacitor 6, the reset transistor 4 and the light emission controlling transistor 5, to the organic EL element 1, which shows that the anode potential of the organic EL element 1 is reflected at one end of the first storage capacitor 6, and a potential corresponding to the extent of degradation is maintained at the first storage capacitor 6 by turning the reset transistor 4 off at an appropriate time. In this case also, it becomes difficult for current to flow if degradation is significant, which shows that the anode potential of the organic EL element 1 becomes high, while if degradation is low it is easy for current to flow which shows that the anode potential becomes low, and these differences are reflected at the first storage capacitor 6.

In the second data write period, the gate line 10 is again made Low, drive potential of the organic EL element 1 that has been written to the first storage capacitor 6 and the gradation control signal Vsig supplied to the data line 8 are written to the second storage capacitor 7 by way of coupling of the first storage capacitor 6, and a potential that reflects degradation of the first organic EL element 1 is maintained at the gate terminal of the driving transistor 2. That is, in a pixel that has significant degradation there is a higher gate voltage, and in a pixel with slight degradation there is a lower gate voltage. By setting the light emission control line 12 low, current that has been subjected to homogenization that differs for each organic EL element 1 according to the extent of degradation flows with a smaller current flowing in pixels with significant degradation and a larger current flowing in pixels that have slight degradation, thus performing uniformity of degradation. The fact that the gradation signal voltage Vsig supplied to the data line 8 in the second data write period determines current flowing in all pixels at the time of homogenization processing is arbitrary, and it is preferable to set so that a particular current flows, because degradation is accelerated if too much current flows.

This homogenization processing is carried out at, for example, about 60 Hz so as to achieve normal display. The state of degradation of the organic EL element 1 for every frame period is read in the current difference extraction period, and is reflected in the homogenized current, which shows that homogenized current is automatically adjusted. Specifically, as a result of homogenization processing, pixels with accelerated degradation have homogenized current moderated, and ultimately the same current flows in all pixels.

Homogenization processing is preferably carried out in a separate period from the normal image display period, but it is also possible to divide a frame into a plurality of subframes, and perform normal display in an initial sub-frame, and after that carry out homogenization processing in the next sub-frame. In this case, it is preferable for the homogenization processing to set the homogenization current to an extent that does not affect display.

Generally, degradation in the light emission intensity of an organic EL element is closely related to the previously described resistance increase, which shows that as well as equalizing the drive voltage using the homogenization processing it is also possible to anticipate homogenization of degradation in light emission intensity, and it is possible to prevent burn-in.

PARTS LIST 1 organic EL element
2 driving transistor
3 switching transistor
4 reset transistor
5 light emission controlling transistor
6 first storage capacitor
7 second storage capacitor
8 data line
9 power supply line
10 gate line
11 reset line
12 light emission control line
13 cathode electrode
14 pixel
P1 driving transistor
P2 p-channel light emission controlling transistor
P3 reset transistor
P4 p-channel switching transistor

The invention claimed is:

1. A pixel circuit for an electroluminescent element comprising:
a data line and a power supply;
a first storage capacitor having a first terminal connected to the data line and comprises:
a section where a semiconductor thin film constituting the switching transistor or the reset transistor extends;
an insulating film formed with the same process as for the gate insulation film of the switching transistor or the reset transistor; and
a metal layer formed with the same process as for the gate electrode of the switching transistor or the reset transistor; wherein the metal layer and the data line are connected by a contact;
a switching transistor having a first terminal connected to the first storage capacitor and which is switched ON and OFF by a selection line connected to a control terminal;
a driving transistor having a control terminal connected to a second terminal of the switching transistor and having a first terminal connected to the power supply;
an organic electroluminescence element which is connected to a second terminal of the driving transistor through a light emission controlling transistor;
a second storage capacitor which connects the control terminal of the driving transistor and the first terminal of the driving transistor; and
a reset transistor which connects the second terminal of the driving transistor and the control terminal of the driving transistor or the first terminal of the switching transistor, wherein the first storage capacitor is formed overlapping the data line.

2. The pixel circuit of claim 1, wherein:
after a voltage corresponding to a threshold voltage of the driving transistor has been written to the gate of the driving transistor, the switching transistor is turned off while the reset transistor and the light emission controlling transistor are turned on, and a voltage corresponding to the voltage of an organic electroluminescence element side terminal of the driving transistor is set at the gate of the driving transistor by current flowing in the driving transistor.

\* \* \* \* \*